United States Patent
Zheng

(10) Patent No.: US 11,240,930 B2
(45) Date of Patent: Feb. 1, 2022

(54) INFORMATION HANDLING SYSTEM HAVING AIR SHROUD FOR MITIGATING TEMPERATURE HOT SPOTS

(71) Applicant: DELL PRODUCTS, LP, Round Rock, TX (US)

(72) Inventor: Jianlin Zheng, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 85 days.

(21) Appl. No.: 16/866,898

(22) Filed: May 5, 2020

(65) Prior Publication Data

US 2021/0352822 A1 Nov. 11, 2021

(51) Int. Cl.
*H05K 7/20* (2006.01)

(52) U.S. Cl.
CPC ..... *H05K 7/20163* (2013.01); *H05K 7/20145* (2013.01); *H05K 7/20727* (2013.01); *H05K 7/20736* (2013.01)

(58) Field of Classification Search
CPC ...... G06F 1/20; G06F 2200/201; G06F 1/206; G06F 1/185; H01L 23/467; H01L 23/367; H05K 7/20145; H05K 7/20172; H05K 7/20154; H05K 7/20727; H05K 7/20736; H05K 7/2039; H05K 7/20009; H05K 7/20209; H05K 1/0203; H05K 7/20163; H05K 7/20; H05K 7/20327; H05K 7/20909; H05K 7/20754; H05K 7/20136; H05K 7/20181; F28F 3/12; F28F 13/02
USPC .......... 361/697, 695, 694, 690, 679.48, 702, 361/704, 679.49, 679.5, 688, 679.51; 165/104.33, 80.3, 80.2; 454/237, 454/E23.099, 706, E23.102
See application file for complete search history.

(56) References Cited

U.S. PATENT DOCUMENTS

| | | | |
|---|---|---|---|
| 7,256,993 B2 | 8/2007 | Cravens et al. | |
| 8,395,892 B2 * | 3/2013 | Li | H05K 7/20727 361/679.49 |
| 9,497,891 B2 | 11/2016 | Alvarado et al. | |
| 2010/0122792 A1 | 5/2010 | Shabbir et al. | |

* cited by examiner

*Primary Examiner* — Mandeep S Buttar
(74) *Attorney, Agent, or Firm* — Larson Newman, LLP

(57) ABSTRACT

An air shroud includes first and second channels, a center bypass port, and a center deflector. The first channel directs a first airflow over a first heat sink of a first processor. A first hot airflow leaves a first rear portion of the first channel. The second channel directs a second airflow over a second heat sink of a second processor. A second hot airflow leaves a second rear portion of the second channel. The center bypass port directs a third airflow away from a first set of memory modules. The center deflector is in physical communication with the first and second channels. The center deflector directs a first portion of the third airflow to the first rear portion of the first channel, and a second portion of the third airflow to the second rear portion of the second channel.

20 Claims, 3 Drawing Sheets

INFORMATION HANDLING SYSTEM HAVING AIR SHROUD FOR MITIGATING TEMPERATURE HOT SPOTS

FIELD OF THE DISCLOSURE

This disclosure generally relates to information handling systems, and more particularly relates to an air shroud for mitigating temperature hot spots within an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

SUMMARY

An air shroud includes first and second channels, a center bypass port, a center deflector, and two side deflectors. The first channel may direct a first airflow over a first heat sink of a first processor. A first hot airflow may leave a first rear portion of the first channel after crossing over the first heat sink of the first processor. The second channel may direct a second airflow over a second heat sink of a second processor. A second hot airflow may leave a second rear portion of the second channel after crossing over the second heat sink of the second processor. The center bypass port is positioned between the first and second channels, and may divert a third airflow away from a first set of memory modules and on top of a memory cover above the first set of memory modules. The center deflector is in physical communication with the first and second channels. The center deflector may direct a first portion of the third airflow to the first rear portion of the first channel, a second portion of the third airflow to the second rear portion of the second channel, and a third portion of the third airflow down to a third hot airflow from the first set of memory modules. Each of the side deflectors includes a support beam and an angled section. The side deflectors may divide the hot airflow from a respective one of the first and second channels into first and second portions, and may direct one of the portions of the hot airflow toward the airflow from the center deflector.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
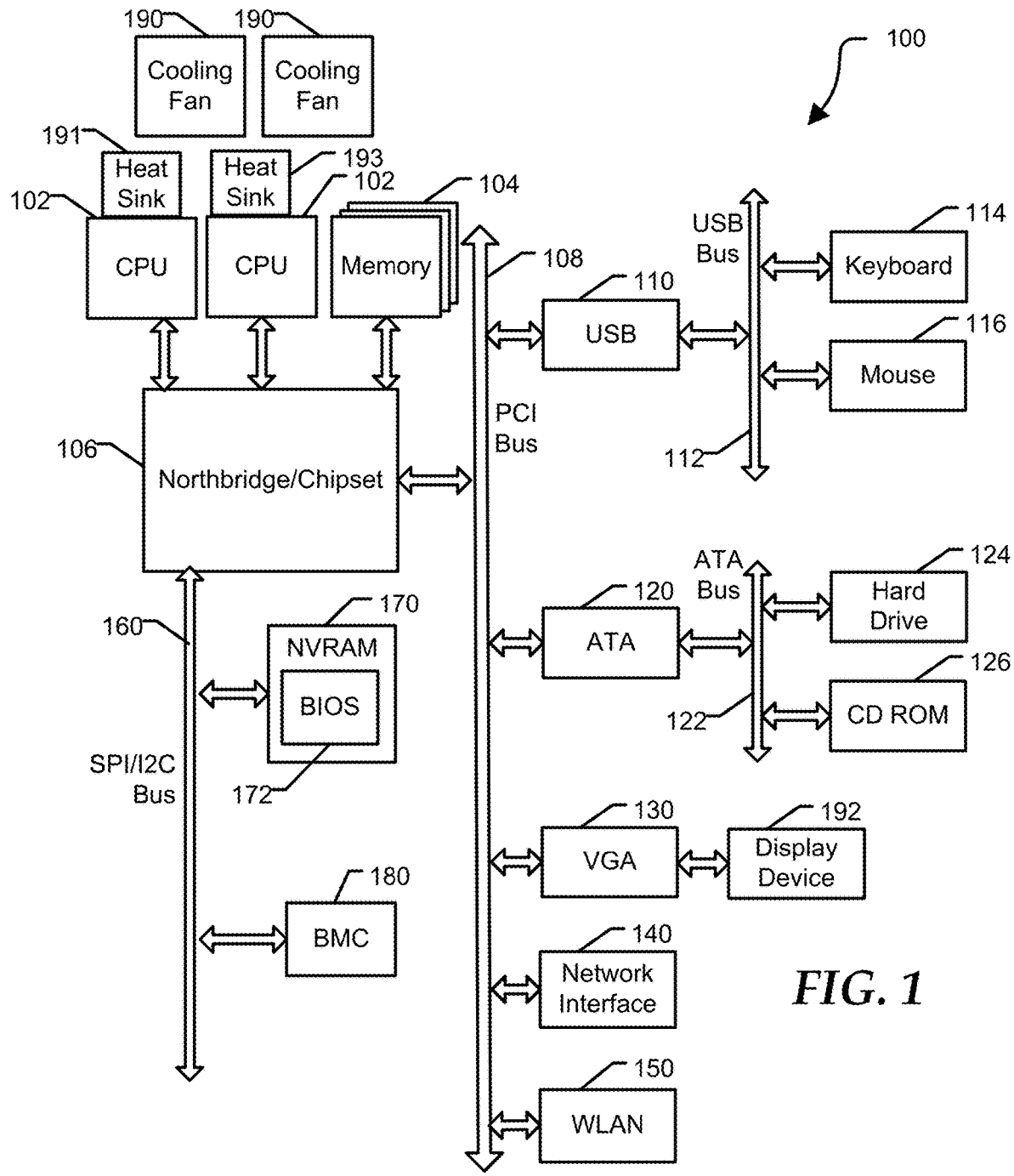
FIG. 1 is a block diagram of a general information handling system according to at least one embodiment of the disclosure.

FIG. 1 illustrates a general information handling system 100 including one or more processors (CPUs) 102, one or more sets of memories 104, a northbridge/chipset 106, a PCI bus 108, a universal serial bus (USB) controller 110, a USB bus 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, a baseboard management controller (BMC) 180, and one or more cooling fans 190. In an embodiment. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPUs 102, which provides various management functions for information handling system 100. For example, an embedded controller may be responsible for power management, cooling management, and the like. An embedded controller included at a data storage system can be referred to as a storage enclosure processor. Cooling fans 190 may provide one or more airflows to the components within information handling 100. For example, cooling fans 190 may provide one or more airflows over heat sinks 191 and 193 in physical communication with CPUs 102, and airflows over different sets of memories 104. In an example, heat sink 191 is in communication with one of CPUs 102, and heat sink 193 is in physical communication with the other one of CPUs 102. In certain examples, one or more sets of memories 104 may be any suitable type of memory including, but not limited to, memory devices, such dual in-line memory modules. In an example, the one or more sets of memories 104 may be located on different locations of information handling system 100 including, but not limited to, one set of memories on a first side of one of CPUs 102, another set of memories in between the CPUs, and another set of memories on the other side of the second CPU.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional buses, not shown for clarity. For example, system 100 can include multiple processor cores, audio devices, and the like. While a particular arrangement of bus technologies and interconnections is illustrated for the purpose of example, one of ordinary skilled in the art will appreciate that the techniques disclosed herein are applicable to other system architectures. System 100 can include multiple CPUs and redundant bus controllers. One or more components can be integrated together. For example, portions of northbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. For example, device controller 130 may provide data to a display device 192 to visually present the information to an individual associated with information handling system 100. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

Figure 2:
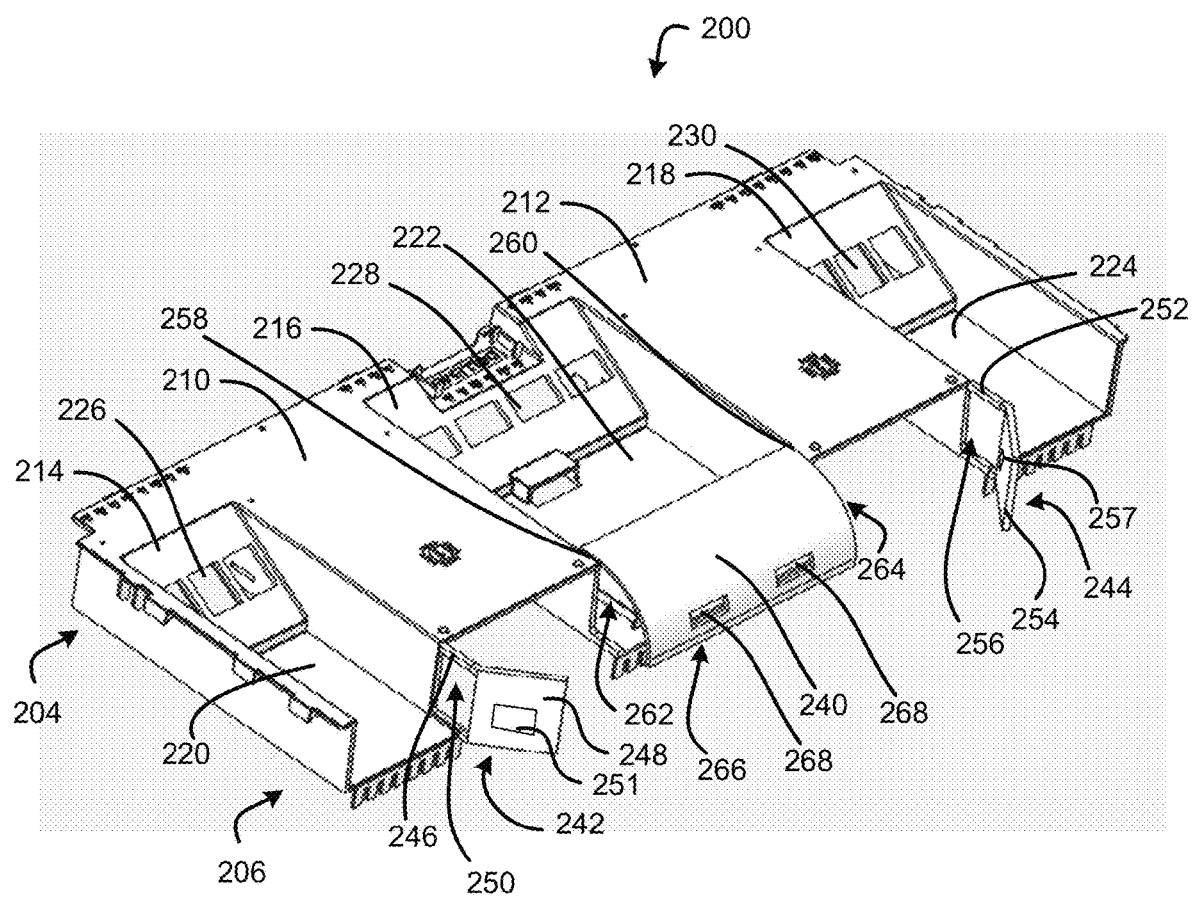
FIG. 2 illustrates an air shroud in accordance with at least one embodiment of the present disclosure.

FIG. 2 illustrates an air shroud 200 according to at least one embodiment of the current disclosure. Air shroud 200 includes a first level 204 and a second level 206. First level 204 includes air channels 210 and 212, down slope sections 214, 216, and 218, and memory covers 220, 222, and 224. Down slop section 214 includes one or more bypass ports 226, down slope section 216 includes one or more bypass ports 228, and down slope section 218 includes one or more bypass ports 230. Second level 206 includes a center deflector 240, and side deflectors 242 and 244.

Side deflector 242 includes a support beam 246 and an angled section 248. Support beam 246 of side deflector 242 includes a first end connected in physical communication with a rear portion of air channel 210, and a second end connected in physical communication with angled section 248. In an example, an air port 250 is formed by an edge of the rear portion of air channel 210, support beam 246, and an edge of angled section 248 as shown in FIG. 2. In certain examples, side deflector 242 may include one or more tuning ports 251 within angled section 248. Side deflector 244 includes a support beam 252 and an angled section 254. Support beam 252 of side deflector 244 includes a first end connected in physical communication with a rear portion of air channel 212, and a second end connected in physical communication with angled section 254. In an example, an air port 256 is formed by an edge of the rear portion of air channel 212, support beam 252, and an edge of angled section 254 as shown in FIG. 2. In certain examples, side deflector 244 may include one or more tuning ports 257 within angled section 254.

In an example, side deflector 242 may deflect an airflow traveling out of the rear portion of air channel 210, and the deflected airflow may be divided into first and second portions. For example, a first portion of deflected airflow may travel, via air port 250, toward a rear portion memory cover 220. The portion of deflected airflow may mix with an airflow traveling over memory cover 220 from bypass port 226. In an example, a second portion of deflected airflow may travel, as directed by angled portion 248, toward the center of air shroud 200. In certain examples, tuning ports 251 may provide a tuning airflow to downstream components, such as PCIe cards, to tune the mixture of hot and cold airflows provided to the downstream components by side deflector 242. In some examples, the tuning of airflows may be controlled by any suitable change in tuning ports 251 including, but not limited to, the number of tuning ports, the size of the tuning ports, and a combination of number and size of the tuning ports.

In an example, side deflector 244 may deflect an airflow traveling out of the rear portion of air channel 212, and the deflected airflow may be divided into first and second portions. For example, a first portion of deflected airflow may travel, via air port 256, toward a rear portion memory cover 224. The portion of deflected airflow may mix with an airflow traveling over memory cover 224 from bypass port 230. In an example, a second portion of deflected airflow may travel, as directed by angled portion 254, toward the center of air shroud 200. In certain examples, tuning ports 257 may provide a tuning airflow to downstream components, such as PCIe cards, to tune the mixture of hot and cold airflows provided to the downstream components by side deflector 244. In some examples, the tuning of airflows may be controlled by any suitable change in tuning ports 257 including, but not limited to, the number of tuning ports, the size of the tuning ports, and a combination of number and size of the tuning ports.

In an example, center deflector 240 may be positioned in between air channels 210 and 212 in any suitable manner. For example, center deflector 240 includes a top edge connected in physical communication with air channels 210 and 212. In an example, center deflector 240 is connected to air channel 210 at connection point 258, and connected by a distal end of the edge of center deflector to air channel 212 at connection point 260. In certain examples, a bottom edge of center deflector 240 may extend beyond rear portions or edges of air channels 210 and 212 and memory cover 222, such that air gaps 262, 264, and 266 exist between center deflector 240 and respective air channels 210 and 212, and memory cover 222. For example, air gap 262 may exist between center deflector 240 and air channel 210 as a result of the center deflector being connected to the air channel at connection point 258 and sloping in a curvature down and away from the air channel as shown in FIG. 2. Similarly, air gap 264 may exist between center deflector 240 and air channel 212 as a result of the center deflector being connected to the air channel at connection point 260 and sloping in a curvature down and away from the air channel as shown in FIG. 2. Additionally, air gap 266 may exist between center deflector 240 and the edge of memory cover 222 based on the center deflector extending beyond the memory cover as shown in FIG. 2. In an example, center deflector 240 may deflect an airflow traveling over memory cover 222 from bypass port 228, and the deflected airflow may be divided into first, second, and third portions. For example, a first portion of deflected airflow may travel, via air gap 262, toward a rear portion of air channel 210. Similarly, a second portion of deflected airflow may travel, via air gap 264, toward a rear portion of air channel 212. Additionally, a third portion of deflected airflow may travel, via air gap 266, toward memory modules exhaust located below memory cover 222. In certain examples, center deflector 240 may include one or more tuning ports 268 located near the bottom edge of the center deflector. In an example, tuning port 268 may provide a tuning airflow to downstream components, such as PCIe cards, to tune or adjust the mixture of hot and cold airflows provided to the downstream components by center deflector 240. In some examples, the tuning of airflows may be controlled by any suitable change in tuning ports 268 including, but not limited to, the number of tuning ports, the size of the tuning ports, and a combination of number and size of the tuning ports.

In certain examples, the first portion of deflected airflow from center deflector 240, directed by air gap 262 toward the rear portion of air channel 210, may mix with the second portion of airflow directed, via angled portion 248, toward the rear portion of the air channel and with hot airflow from air channel 210. Similarly, the second portion of deflected airflow from center deflector 240, directed by air gap 264 toward the rear portion of air channel 212, may mix with the second portion of airflow directed by angled portion 248 toward the rear portion of the air channel and with hot airflow from air channel 212. Additionally, a third portion of deflected airflow may travel, via air gap 266, below memory cover 222 to mix with hot airflow from memory modules below the memory cover. In an example, the mixing of airflows at the rear of air channels 210 and 212 and the mixing of airflows below memory cover 222 may reduce the temperature of the airflow from the air channels as will be described below with respect to FIG. 3.

Figure 3:
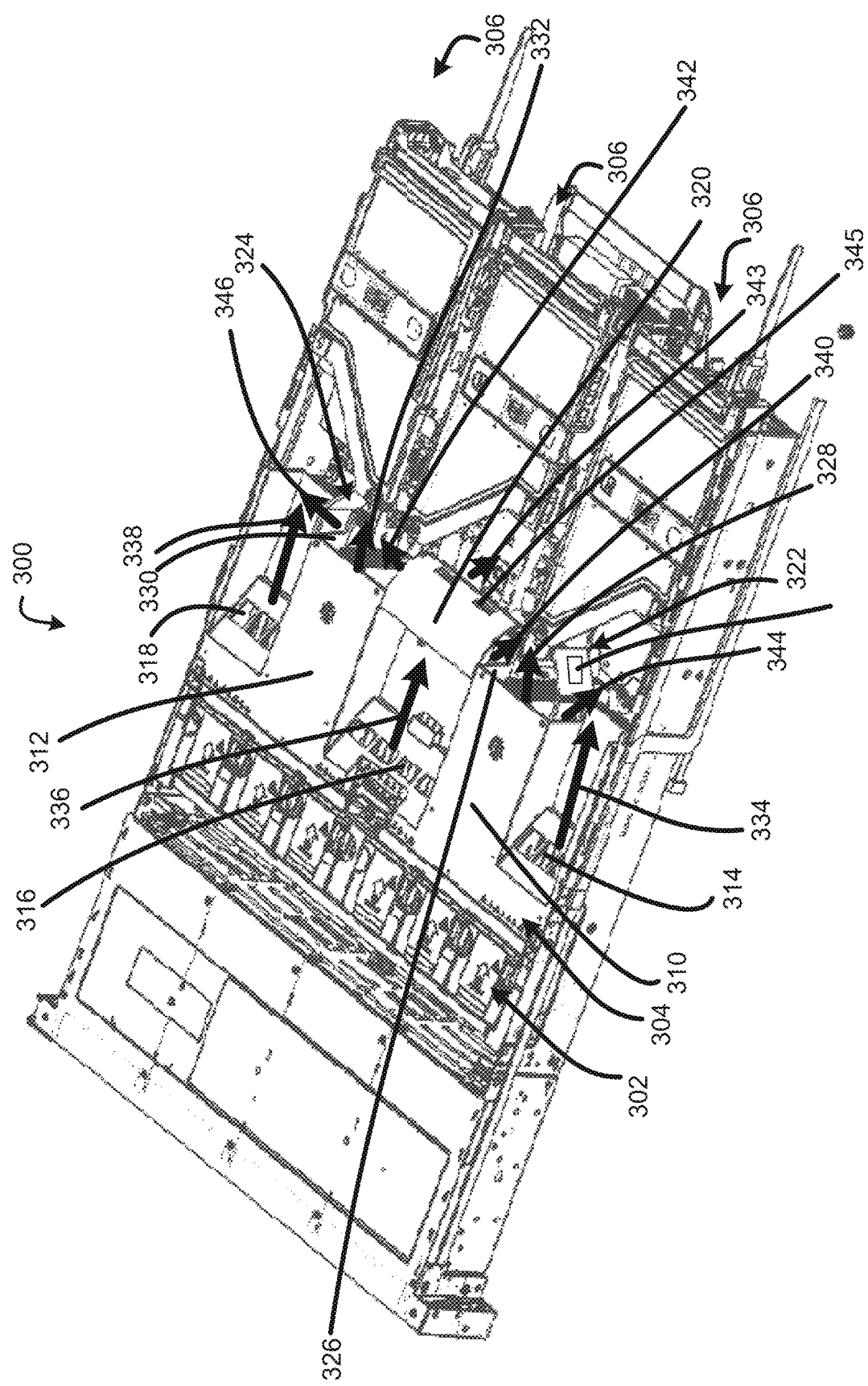
FIG. 3 illustrates an information handling system including an air shroud in accordance with at least one embodiment of the present disclosure.

FIG. 3 shows an information handling system 300 including one or more cooling fans 302, an air shroud 304, and multiple components 306 in accordance with at least one embodiment of the present disclosure. In an example, air shroud 304 includes air channels 310 and 312, bypass ports 314, 316, and 318, a center deflector 320, and side deflectors 322 and 324. Components 306 may be any suitable type of components including, but not limited to, peripheral component interconnect express (PCIe) cards. In certain examples, information handling system 300 may be any suitable information handling system including, but not limited to, information handling system 100 of FIG. 1. In an example, cooling fans 302 may be any suitable cooling fans including, but not limited to, cooling fans 190 of FIG. 1. Air shroud 304 may be any suitable air shroud including, but not limited to, air shroud 200 of FIG. 2. In an example, information handling system 300 may include additional components without varying from the scope of this disclosure.

In an example, air shroud 304 may be connected in front of cooling fans 302, such that the air shroud may direct airflow from the cooling fans across multiple downstream components including, but not limited to, CPUs 102, heat sinks 191 and 193, memories 104, and other components 306. In previous information handling systems having a previous air shroud, the air shroud would first direct the airflow from the cooling fans across the CPUs, heat sinks, and memories, and then the already heated airflow is then provided across the downstream components. However, in these previous information handling systems with previous air shroud, the heated airflow from the CPUs and memories may create hot spots at the air inlets of the downstream components. In these situations, the hot spots created an environment that made it very difficult to keep the temperature of the downstream components below a threshold voltage. Therefore, these information handling systems would implement different measure in an attempt to keep the temperatures of the downstream components below the threshold temperature. These measures included, but were not limited to, providing power limits on the CPUs and memories, and running the cooling fans at high speeds. Thus, these previous measures would limit capabilities of the CPUs and memories, as well as, increase power consumption by the cooling fans. Therefore, air shroud 304 improves information handling system 300 by eliminating hot spots at the air inlets of components 306, such that power limits do not need to be placed on CPUs 102 and memories 104, and cooling fans 302 do not need to be run at high speeds to keep the temperatures of the components, such as PCIe cards, below the threshold temperature.

Air channel 310 of air shroud 304 may be located over a CPU and heat sink, such as CPU 102 and heat sink 191 of FIG. 1, such that the air channel may direct an airflow from cooling fans 302 across the CPU and heat sink and then out a rear portion 326 of the air channel. In an example, the airflow directed out of rear portion 326 of air channel 310 may be a hot airflow 328, which was heated as it traveled across heat sink 191 of CPU 102. Air channel 312 of air shroud 304 may be located over a CPU and heat sink, such as CPU 102 and heat sink 193 of FIG. 1, such that the air channel may direct an airflow from cooling fans 302 across the CPU and heat sink and then out a rear portion 330 of the air channel. In an example, the airflow directed out of rear portion 330 of air channel 312 may be a hot airflow 332, which was heated as it traveled across heat sink 193 of CPU 102.

In an example, bypass port 316 may be located in between air channels 310 and 312, bypass port 314 may be located on an opposite side of air channel 310 as bypass port 316, and bypass port 318 may be located on an opposite side of air channel 312 as bypass port 316. Bypass port 314 may provide an airflow 334 that may travel along a memory cover of air shroud 304, such that the airflow is not heated by a set of memories, such as a set of memories 104 of FIG. 1, located on a one side of the CPU below air channel 310. Similarly, bypass port 316 may provide an airflow 336 that may travel along a memory cover of air shroud 304, such that the airflow is not heated by another set of memories, such as a set of memories 104 of FIG. 1, located in between the CPUs below air channels 310 and 312. Additionally, bypass port 318 may provide an airflow 338 that may travel along a memory cover of air shroud 304, such that the airflow is not heated by a set of memories, such as a set of memories 104 of FIG. 1, located on another side of the CPU below air channel 312.

In an example, airflow 336 may be forced into center deflector 320, which in turn may deflect the airflow into three separate portions of airflow 340, 342, and 343. For example, center deflector 320 may direct airflow portion 340 toward rear portion 326 of air channel 310 via an air gap between the air channel and the center deflector. Similarly, center deflector 320 may direct airflow portion 342 toward rear portion 330 of air channel 312 via an air gap between the air channel and the center deflector. Additionally, center deflector 320 may direct airflow portion 343 down below a memory cover to mix with hot airflow from memory modules below the memory cover. Moreover, center deflector 320 may include one or more tuning ports 345 to tune the airflow provided to components 306 as described above with respect to FIG. 2.

In an example, side deflector 322 may divide hot airflow 328 into two portions, such as hot airflow portion 344 and the remaining portion of hot airflow 328. For example, an air port formed between side deflector 322 and air channel 310 may direct hot airflow portion 344 toward airflow 334 traveling from bypass port 314. In this example, side deflector 322 may cause hot airflow portion 344 to mix with airflow 334 to reduce a temperature of the airflow at the inlet to components 306 downstream from the set of memories and CPU below air channel 310. Additionally, the angled section of side deflector 322 may direct the remainder of hot airflow 328 away from the inlets of downstream components 306 and toward the airflow portion 340 diverted by center deflector 320. In an example, the inlets of downstream components 306 may be inlets of full height PCIe cards. In certain examples, the mixing of hot airflow 328 with the cool airflow portion 340 may reduce the airflow temperature provided to downstream components 306. In an example, the tuning of airflow temperatures provided to downstream components 306 may be tuned by one or more tuning ports 347 located within side deflector 322 as described above with respect to FIG. 2. For example, the larger tuning ports 347, the more hot airflow portion 344 provided to mix with airflow 334 and less hot airflow 328 to mix with airflow portion 340. Changes in these airflow amounts may control airflow temperatures provided to all downstream components 306.

In an example, side deflector 324 may divide hot airflow 332 into two portions, such as hot airflow portion 346 and the remaining portion of hot airflow 332. For example, an air port formed between side deflector 324 and air channel 312 may direct hot airflow portion 346 toward airflow 338 traveling from bypass port 318. In this example, side deflector 332422 may cause hot airflow portion 346 to mix with airflow 338 to reduce a temperature of the airflow at the inlet to components 306 downstream from the set of memories and CPU below air channel 312. Additionally, the angled section of side deflector 324 may direct the remainder of hot airflow 332 away from the inlets of downstream components 306 and toward the airflow portion 342 diverted by center deflector 320. In an example, the inlets of downstream components 306 may be inlets of full height PCIe cards. In certain examples, the mixing of hot airflow 332 with the cool airflow portion 342 may reduce the airflow temperature provided to downstream components 306. In an example, the tuning of airflow temperatures provided to downstream components 306 may be tuned by one or more tuning ports located within side deflector 324. For example, the larger the tuning ports, the more hot airflow portion 346 provided to mix with airflow 338 and less hot airflow 332 to mix with airflow portion 342. Changes in these airflow amounts may control airflow temperatures provided to all downstream components 306.

In an example, the mixing of airflows by center deflector 320 and side deflector 322 and the center deflector and side deflector 324 may effectively mitigate any potential hot spots in the downstream components 306. Moreover, the mixing of airflow 343 from center deflector 320 and hot airflows from memory modules below the center deflector may effectively mitigate any potential hot spots in the downstream components 306. Additionally, the airflow mixing may provide a uniform temperature to downstream components 306. Air shroud 304 further provides the improvements disclosed above without impact the total airflow or impedance within information handling system 300.

Although only a few exemplary embodiments have been described in detail in the exemplary embodiments without materially departing from the novel teachings and advantages of the embodiments of the present disclosure. For example, the methods described in the present disclosure can be stored as instructions in a computer readable medium to cause a processor to perform the method. Additionally, the methods described in the present disclosure can be stored as instructions in a non-transitory computer readable medium, such as a hard disk drive, a solid state drive, a flash memory, and the like. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An air shroud comprising:
    a first channel to direct a first airflow over a first heat sink of a first processor, wherein a first hot airflow leaves a first rear portion of the first channel;
    a second channel to direct a second airflow over a second heat sink of a second processor, wherein a second hot airflow leaves a second rear portion of the second channel;
    a center bypass port positioned between the first and second channels, the center bypass port to direct a third airflow away from a first set of memory modules; and
    a center deflector in physical communication with the first and second channels, the center deflector to direct a first portion of the third airflow to the first rear portion of the first channel, and to direct a second portion of the third airflow to the second rear portion of the second channel.

2. The air shroud of claim 1 further comprising:
    a side deflector including:
        a support beam having a first end in physical communication with the first rear portion of the first channel, and a second end; and
        an angled section in physical communication with the second end of the support beam, the angled portion to extend at an obtuse angle from the second end of the support beam across an opening of the first rear portion, wherein a first portion of the first hot airflow escapes via an air port formed by a first edge of the first rear portion, the support beam, and a first edge of the angled section.

3. The air shroud of claim 2 wherein the angled section of the side deflector directs a second portion of the first hot airflow toward the first portion of the third airflow directed by the center deflector.

4. The air shroud of claim 2 further comprising:
    a side bypass port positioned opposite side of the first channel as the first bypass port, the side bypass port to direct a fourth airflow away from a second set of memory modules, wherein the fourth airflow mixes with the first portion of the first hot airflow.

5. The air shroud of claim 1 further comprising:
    a side deflector including:
        a support beam having a first end in physical communication with the second rear portion of the second channel, and a second end; and
        an angled section in physical communication with the second end of the support beam, the angled portion to extend at an obtuse angle from the second end of the support beam across an opening of the second rear portion, wherein a first portion of the second hot airflow escapes via an air port formed by a first edge of the second rear portion, the support beam, and a first edge of the angled section.

6. The air shroud of claim 5 wherein the angled section of the side deflector directs a second portion of the second hot airflow toward the second portion of the third airflow directed by the center deflector.

7. The air shroud of claim 5 further comprising:
    a side bypass port positioned opposite side of the second channel as the first bypass port, the side bypass port to direct a fourth airflow away from a second set of memory modules, wherein the fourth airflow mixes with the first portion of the second hot airflow.

8. An information handling system comprising:
    first and second processors;
    a first heat sink in physical communication with the first processor;
    a second heat sink in physical communication with the second processor;
    a plurality of cooling fans to provide first, second, and third airflows; and
    an air shroud including:
        a first channel to direct the first airflow over the first heat sink of the first processor, wherein a first hot airflow leaves a first rear portion of the first channel;
        a second channel to direct the second airflow over the second heat sink of the second processor, wherein a second hot airflow leaves a second rear portion of the second channel;
        a center bypass port positioned between the first and second channels, the center bypass port to direct the third airflow away from a first set of memory modules; and
        a center deflector in physical communication with the first and second channels, the center deflector to direct a first portion of the third airflow to the first rear portion of the first channel, and to direct a second portion of the third airflow to the second rear portion of the second channel.

9. The information handling system of claim 8, wherein the air shroud further comprises:
    a side deflector including:
        a support beam having a first end in physical communication with the first rear portion of the first channel, and a second end; and
        an angled section in physical communication with the second end of the support beam, the angled portion to extend at an obtuse angle from the second end of the support beam across an opening of the first rear portion, wherein a first portion of the first hot airflow escapes via an air port formed by a first edge of the first rear portion, the support beam, and a first edge of the angled section.

10. The information handling system of claim 9 wherein the angled section of the side deflector directs a second portion of the first hot airflow toward the first portion of the third airflow directed by the center deflector.

11. The information handling system of claim 9 wherein the air shroud further comprises:
   a side bypass port positioned opposite side of the first channel as the first bypass port, the side bypass port to direct a fourth airflow away from a second set of memory modules, wherein the fourth airflow mixes with the first portion of the first hot airflow.

12. The information handling system of claim 8 wherein the air shroud further comprises:
   a side deflector including:
      a support beam having a first end in physical communication with the second rear portion of the second channel, and a second end; and
      an angled section in physical communication with the second end of the support beam, the angled portion to extend at an obtuse angle from the second end of the support beam across an opening of the second rear portion, wherein a first portion of the second hot airflow escapes via an air port formed by a first edge of the second rear portion, the support beam, and a first edge of the angled section.

13. The information handling system of claim 12 wherein the angled section of the side deflector directs a second portion of the second hot airflow toward the second portion of the third airflow directed by the center deflector.

14. The information handling system of claim 12 wherein the air shroud further comprises:
   a side bypass port positioned opposite side of the second channel as the first bypass port, the side bypass port to direct a fourth airflow away from a second set of memory modules, wherein the fourth airflow mixes with the first portion of the second hot airflow.

15. An information handling system comprising:
   a first heat sink in physical communication with a first processor;
   a second heat sink in physical communication with a second processor;
   a plurality of cooling fans to provide first, second, and third airflows;
   a plurality of downstream components; and
   an air shroud including:
      a first channel to direct the first airflow over the first heat sink of the first processor, wherein a first hot airflow leaves a first rear portion of the first channel;
      a second channel to direct the second airflow over the second heat sink of the second processor, wherein a second hot airflow leaves a second rear portion of the second channel;
      a center bypass port positioned between the first and second channels, the center bypass port to direct the third airflow away from a first set of memory modules;
      a center deflector in physical communication with the first and second channels, the center deflector to direct a first portion of the third airflow to the first rear portion of the first channel, to direct a second portion of the third airflow to the second rear portion of the second channel, to direct a third portion of the third airflow to a first set of memory modules below the air shroud, wherein the center deflector include a tuning port along a bottom edge of the center deflector, the tuning port to direct a fourth portion of the third airflow to the downstream components.

16. The information handling system of claim 15, wherein the air shroud further comprises:
   a side deflector including:
      a support beam having a first end in physical communication with the first rear portion of the first channel, and a second end; and
      an angled section in physical communication with the second end of the support beam, the angled portion to extend at an obtuse angle from the second end of the support beam across an opening of the first rear portion, wherein a first portion of the first hot airflow escapes via an air port formed by a first edge of the first rear portion, the support beam, and a first edge of the angled section.

17. The information handling system of claim 16 wherein the angled section of the side deflector directs a second portion of the first hot airflow toward the first portion of the third airflow directed by the center deflector.

18. The information handling system of claim 16 wherein the air shroud further comprises:
   a side bypass port positioned opposite side of the first channel as the first bypass port, the side bypass port to direct a fourth airflow away from a second set of memory modules, wherein the fourth airflow mixes with the first portion of the first hot airflow.

19. The information handling system of claim 15 wherein the angled section of the side deflector directs a second portion of the second hot airflow toward the second portion of the third airflow directed by the center deflector.

20. The information handling system of claim 15 wherein the air shroud further comprises:
   a side bypass port positioned opposite side of the second channel as the first bypass port, the side bypass port to direct a fourth airflow away from a second set of memory modules, wherein the fourth airflow mixes with the first portion of the second hot airflow to create a mixed airflow.

* * * * *